United States Patent
Schmidt

(10) Patent No.: US 7,451,361 B2
(45) Date of Patent: Nov. 11, 2008

(54) METHOD AND APPARATUS FOR FORWARD ERROR CORRECTION IN A CONTENT DISTRIBUTION SYSTEM

(75) Inventor: Mark S. Schmidt, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 420 days.

(21) Appl. No.: 11/302,445

(22) Filed: Dec. 13, 2005

(65) Prior Publication Data

US 2007/0098110 A1    May 3, 2007

Related U.S. Application Data

(60) Provisional application No. 60/647,553, filed on Jan. 27, 2005.

(51) Int. Cl.
*H03M 13/27*   (2006.01)
*H03M 13/29*   (2006.01)

(52) U.S. Cl. ............... 714/701; 714/755; 714/776

(58) Field of Classification Search ............ 714/701, 714/755, 776
See application file for complete search history.

(56) References Cited

U.S. PATENT DOCUMENTS

| | | | |
|---|---|---|---|
| 6,826,140 B2 * | 11/2004 | Brommer et al. | 369/94 |
| 7,260,764 B2 * | 8/2007 | Chen | 714/774 |
| 7,352,795 B2 * | 4/2008 | Furman et al. | 375/142 |
| 2002/0051501 A1 * | 5/2002 | Demjanenko et al. | 375/298 |
| 2002/0150167 A1 * | 10/2002 | Demjanenko et al. | 375/259 |
| 2005/0246616 A1 * | 11/2005 | Choi et al. | 714/801 |
| 2006/0092902 A1 * | 5/2006 | Schmidt | 370/342 |

\* cited by examiner

*Primary Examiner*—Stephen M Baker
(74) *Attorney, Agent, or Firm*—Larry T. Cullen

(57) ABSTRACT

Method and apparatus for encoding transport stream packets is described. In one example, frames of transport stream packets are block coded to produce block coded symbols. The block coded symbols are interleaved for each of the frames using convolutional interleaving to produce interleaved data. The interleaved data is randomized. The interleaved data is set partitioned for each of the frames into un-coded bits and bits to be encoded. For each of the frames: A low density parity check (LDPC) code is applied to the bits to be encoded to generate a codeword having information bits and parity bits. Groups of interleaved bits are generated from bits in the codeword. Symbols formed from the groups of interleaved bits and the un-coded bits are mapped to points in a quadrature amplitude modulation (QAM) constellation.

20 Claims, 4 Drawing Sheets

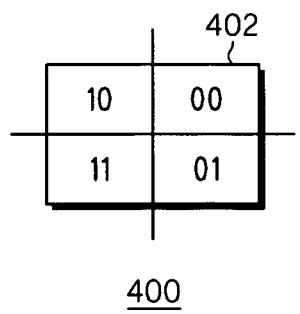
*FIG. 4*
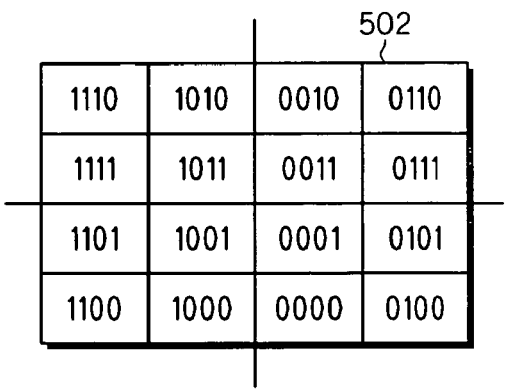
*FIG. 5*
*FIG. 6*
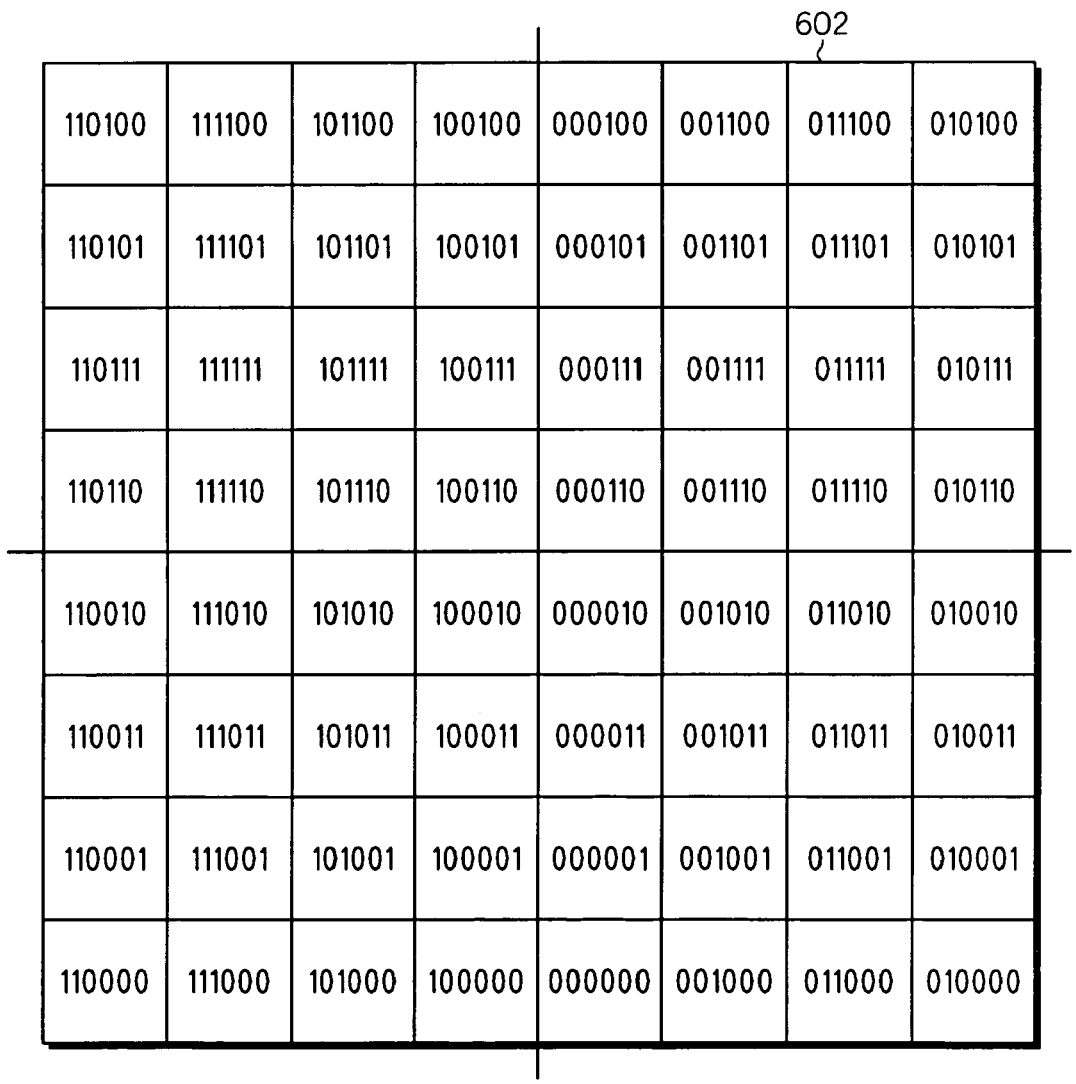

METHOD AND APPARATUS FOR FORWARD ERROR CORRECTION IN A CONTENT DISTRIBUTION SYSTEM

CROSS-REFERENCE TO RELATED APPLICATIONS

This application claims benefit of U.S. Provisional application Ser. No. 60/647,553, filed Jan. 27, 2005, which is incorporated by reference herein.

BACKGROUND OF THE INVENTION

1. Field of the Invention

The present invention relates to content delivery systems and, more particularly, to a method and apparatus for forward error correction (FEC) in a content distribution system.

2. Description of the Background Art

The demand for broadband content by business and residential subscribers is continually increasing. Broadband content includes multiple types of communications and data, such as broadcast television channels, video-on-demand, streaming video, multimedia data, Internet access, packet telephony, etc. To meet the increasing demand, it is typically necessary to increase throughput to each subscriber and improve overall quality of service. Current delivery technologies include several variations of digital subscriber line (DSL) technology, which uses telephony facilities, and cable modem systems using cable television facilities and hybrid fiber coaxial (HFC) distribution networks.

Delivery of data services over cable television systems is typically compliant with the Data-over-cable-service-interface-specifications (DOCSIS) standard. The content is typically modulated using quadrature amplitude modulation (QAM). Current cable QAM standards use conventional forward error correction (FEC) techniques to transmit the data downstream. FEC is a system of error control for data transmission where the receiving device has the capability to detect and correct fewer than a predetermined number or fraction of bits or symbols corrupted by transmission errors. FEC is accomplished by adding redundancy to the transmitted information using a predetermined algorithm. The original information may or may not appear in the encoded output; codes that include the un-modified input in the output are systematic, while those that do not are nonsystematic.

SUMMARY OF THE INVENTION

Method and apparatus for encoding transport stream packets is described. In one embodiment, frames of transport stream packets are block coded to produce block coded symbols. The block coded symbols are interleaved for each of the frames using convolutional interleaving to produce interleaved data. The interleaved data is randomized. The interleaved data is set partitioned for each of the frames into un-coded bits and bits to be encoded. For each of the frames: A low density parity check (LDPC) code is applied to the bits to be encoded to generate a codeword having information bits and parity bits. Groups of interleaved bits are generated from bits in the codeword. Symbols formed from the groups of interleaved bits and the un-coded bits are mapped to points in a quadrature amplitude modulation (QAM) constellation.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3-6 illustrate QAM mapping in accordance with one or more aspects of the invention;

To facilitate understanding, identical reference numerals have been used, where possible, to designate identical elements that are common to the figures.

DETAILED DESCRIPTION OF THE INVENTION

Figure 1:
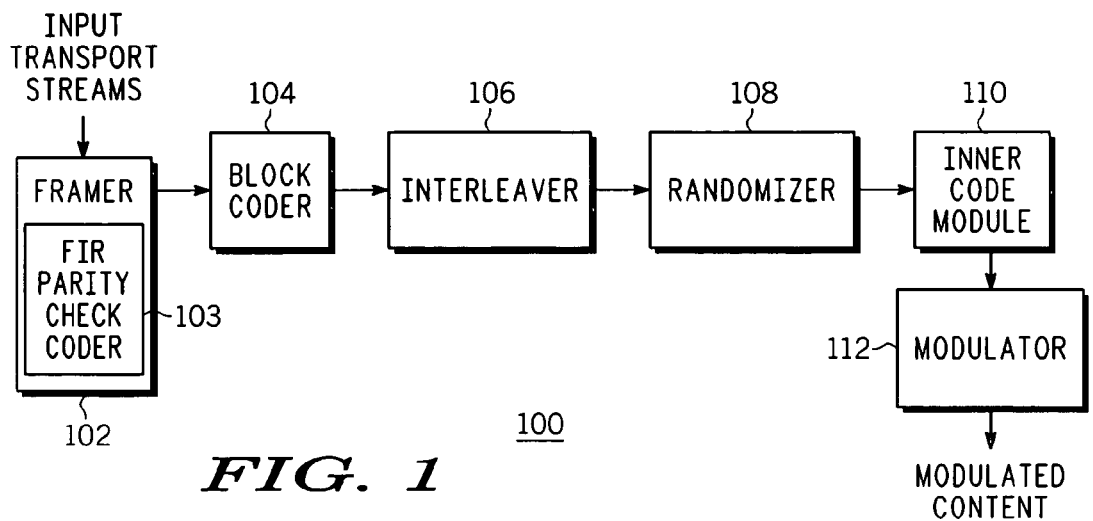
FIG. 1 is a block diagram depicting an exemplary embodiment of a content encoding system constructed in accordance with one or more aspects of the invention.

FIG. 1 is a block diagram depicting an exemplary embodiment of a content encoding system 100 constructed in accordance with one or more aspects of the invention. The encoding system 100 includes a framer 102, a block coder 104, an interleaver 106, a randomizer 108, an inner code module 110, and a modulator 112. The encoding system 100 is configured to process one or more content streams to produce modulated data for transmission over a channel towards one or more decoders. For example, the encoding system 100 may be used to encode content for downstream transmission towards a modem in a data-over-cable service interface specification (DOCSIS) architecture.

For purposes of clarity by example, the input content is described as one or more MPEG-2 (moving picture experts group, version 2) transport streams. Notably, an MPEG-2 transport stream (TS) includes a sequence of 188-byte packets, as is well known in the art. It is to be understood that the encoding system 100 may be configured to process other types of content streams known in the art. For purposes of clarity by example, aspects of the encoder 100 are described herein with respect to 64-QAM, 256-QAM, and 1024-QAM modulation modes. Those skilled in the art will appreciate that the encoder 100 may be configured to generally use square M-QAM modulation modes.

In particular, the framer 102 processes the input TS packets to produce superframes of TS packets. As discussed below, the framing performed by the framer 102 depends on the parameters of the block coder 104 and the frame size used by the inner code module 110. In one embodiment, the framer 102 includes a finite impulse response (FIR) parity check coder 103. The FIR parity check coder 103 applies an FIR parity check based linear block code to the TS packets. The parity data produced by the FIR parity check coder 103 may be inserted as the sync byte of each 188-byte TS packet to provide packet delineation, as well as error detection capability independent of the FEC described below.

The TS packets output from the framer 102 are received by the block coder 104. The block coder 104 applies a block code to the TS packets. In one embodiment, the block coder 104 applies a Reed-Solomon (RS) block code. For example, the block coder 104 may apply an (n,k)=(128,122), t=3 byte-error correcting RS code over Galois Field (GF) (128) to 7-bit symbols formed from the TS packets. That is, the block coder 104 produces 128-symbol blocks having six parity symbols, where each of the symbols is seven bits. A bit error occurring within three or less symbols of a block at the decoder can be corrected. Details of a (128,122), t=3 RS code are described in the specification of the International Telecommunications Union (ITU) Recommendation J.83 Annex B (referred to as ITU J83. B).

The block coded symbols produced by the block coder 104 are received by the interleaver 106. In one embodiment, the interleaver 106 comprises a, (I,J) convolutional interleaver. As is well known in the art, an (I,J) interleaver sequentially shifts the block coded symbols into a bank of I registers. Each successive register has J symbols more storage than the preceding register. For example, the interleaver 106 may have a depth of I=128. The first interleaver path has zero delay, the second has J symbol period of delay, the third 2*J symbol periods of delay, and so on up to the $128^{th}$ path, which has 127*J symbol periods of delay. If burst noise in the channel causes a series of bad symbols, they are spread over many symbol blocks (e.g., RS blocks) by a deinterleaver in the decoder such that the resultant symbol errors per block are within the range of the block decoder correction capability. The interleaver 106 may be configured with a single interleaving depth, e.g., (128,1). Alternatively, the interleaver 106 may be configured to employ variable interleaving (e.g., J may be an integer between 1 and 8). In one embodiment, I=128, J=1, 2, 3, or 4 interleaving is used with the (128,122), t=3 RS coding over GF(128) described above.

In another embodiment, the block coder 104 may apply an (n,k)=(195,187), t=4 byte-error correcting RS cover over GF(256) to each 187-byte TS packet (the sync byte is excluded). That is, the block coder 104 produces 195-byte blocks having eight parity bytes such that a bit error occurring within four or less bytes of a block at the decoder can be corrected. In such an embodiment, the interleaver 106 may employ (I,J)=(195,1) convolutional interleaving.

The symbol stream output by the interleaver 106 is received by the randomizer 108. The randomizer 108 adds a pseudorandom noise (PN) sequence to the data symbols to generate a pseudorandom sequence of symbols. The randomizer can be initialized at the start of each superframe, e.g., at the beginning of the 675 RS codeword block that forms a superframe as described immediately below. The inner code module 110 applies LDPC coding, bit interleaving, and QAM symbol matching to the symbols output by the randomizer 108. The output of the inner code module 110 is modulated by the modulator 112 in accordance with well-known QAM modulation techniques.

Figure 2:
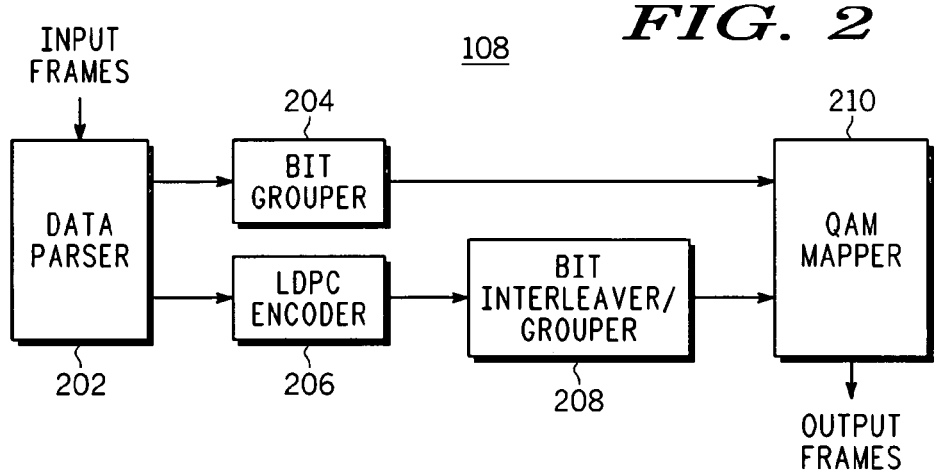
FIG. 2 is a block diagram depicting an exemplary embodiment of an inner code module of FIG. 1 constructed in accordance with one or more aspects of the invention.

In particular, FIG. 2 is a block diagram depicting an exemplary embodiment of the inner code module 110 constructed in accordance with one or more aspects of the invention. The inner code module 110 includes a data parser 202, a bit grouper 204, an LDPC encoder 206, a bit interleaver/grouper 208, and a QAM mapper 210. The data parser 202 is configured to parse a frame of information bits into un-coded bits and bits to be encoded using set partitioning. In one embodiment, a frame of information bits comprises 86,400 bits, 118,800 bits, and 151,200 bits for 64-, 256-, and 1024-QAM, respectively. The number of bits in the frame dictates the size of the superframe produced by the framer 102. For example, If (128,122) t=3 RS coding over GF(128) is used, a 151,200 bit frame for 1024-QAM includes 168.75 RS blocks of 128 7-bit symbols. Over four LDPC code frames, exactly 675 RS blocks will be carried by the inner code. Thus, sufficient TS packets to generate 675 RS blocks comprise a superframe. In another example, if (195,187) t=4 RS coding over GF(256) is used, a 151,200 bit frame for 1024-QAM includes 96.92307 RS blocks of 195-bytes. Over 13 LDPC code frames, exactly 1260 RS blocks will be carried by the inner code. Thus, sufficient TS packets to generate 1260 RS blocks comprise a superframe. A suitable preamble can be inserted into the QAM symbol stream at the beginning of each superframe to allow for detection of the start of the superframe. Alternatively, a preamble may be inserted at the beginning of each 16,200 QAM symbol frame for rapid frame sync detection of LDPC code blocks, while a separate unique preamble is used for superframe detection (e.g., every 675 RS codewords for the (128,122) RS code example above).

In one embodiment, the data parser 202 parses a frame of information bits into 54,000 bits to be encoded, and 32,400 un-coded bits, 64,800 un-coded bits, and 97,200 un-coded bits for 64-, 256-, and 1024-QAM, respectively. The un-coded bits are combined, by the bit grouper 204, into 16,200 groups (2, 4, or 6 bits per group for 64-, 256-, and 1024-QAM, respectively) that form the most significant bits (MSBs) of each M-QAM symbol. That is, there are 16,200 symbols per frame.

The bits to be encoded are provided to the LDPC encoder 206. The LDPC encoder 206 applies a systematic rate 5/6 LDPC code of length 64,800 bits to select four Gray-coded least-significant bits (LSBs) of each 6, 8, or 10-bit 64-, 256-, or 1024-QAM symbol, respectively, in a frame. LDPC coding is described briefly below.

An LDPC code is defined by its sparse parity check matrix, H, of dimension (N−K)×N, which can be viewed as connections between nodes in a bipartite (or two sided) graph. A regular (λ,ρ) code has λ ones in each column, and ρ ones in each row of H. The variable λ is the column, bit, or variable node degree, while the variable ρ is the row or check node degree. The rate of a regular LDPC code is R=K/N=(1−λ/ρ). An irregular LDPC code has varying values of λ and ρ for different columns and rows, respectively. A codeword vector, $c^T$, of N bits must satisfy the parity check constraints $Hc^T=0$. A randomly selected graph will yield a good code with high probability. This is consistent with Shannon's random coding theorem that finds long random codes yield good performance. That said, it is not desirable to choose a graph of low girth, i.e., short cycles of length 4 should be avoided. A cycle length of 4 occurs when two bit nodes and two check nodes are interconnected by 4 edges. In terms of the H matrix, no two rows should have 1's in more than one column location. Encoding of block codes is generally done using a K×N code generator matrix, G, that satisfies $GH^T=0$. A length K-bit information vector, u, forms the codeword through the matrix multiplication, c=uG. This encoding operation requires $O(N^2)$ operations (quadratic in time) and further requires the generation of G from the sparse random H.

Better code performance can be achieved using an irregular LDPC code. An irregular LDPC code is described by node degree distribution polynomials, λ(x) for bit (variable) nodes and ρ(x) for check nodes, where $$\lambda(x) = \sum_{i=2}^{d_v} \lambda_i x^{i-1} \text{ and} \qquad \text{Eq. 1}$$

$$\rho(x) = \sum_{i=2}^{d_c} \rho_i x^{i-1}. \qquad \text{Eq. 2}$$

In Equations 1 and 2, $\lambda_i$ and $\rho_i$ are the fractions of graph edges connected to bit and check nodes, respectively that have degree i; $d_v$ and $d_c$ represent the maximum variable and check node degrees in the graph. Generally, for linearly independent check equations, the design rate of the irregular code is:

$$R = 1 - \frac{\int_0^1 \rho(x)dx}{\int_0^1 \lambda(x)dx} \qquad \text{Eq. 3}$$

and the number of bit/variable nodes of degree i is the integer part of:

$$N_v(i) = \frac{N\lambda_i}{i\int_0^1 \lambda(x)dx} \qquad \text{Eq. 4}$$

while the number of check nodes of degree i is:

$$N_c(i) = \frac{N\rho_i}{i\int_0^1 \rho(x)dx}. \qquad \text{Eq. 5}$$

Linear-time encoding for a systematic code can be done by using a "staircase" matrix for the parity bit calculations. The staircase matrix has the form:

$$H = [H_1 H_2] \qquad \text{Eq. 6}$$

$$H_2 = \begin{bmatrix} 1 & & & & & \\ 1 & 1 & & & & \\ & 1 & 1 & & & \\ & & & \ddots & & \\ & & & & 1 & 1 \\ & & & & & 1 & 1 \end{bmatrix},$$

where $H_2$ is an (N-K)-(N-K) matrix that allows recursive parity bit calculation from the K-systematic codeword bits using the systematic bits specified by rows in the (N-K)×K $H_1$ matrix. Note that all non-"1" entries in the $H_2$ matrix above are zero. For a more detailed explanation of irregular code design, the reader is referred to M. Yang et al., "Design of Efficiently Encodable Moderate-Length High-Rate Irregular LDPC Codes," IEEE Trans. Commun., vol. 52, pp. 564-571, April 2004.

The $H_1$ matrix may be divided into a number of submatrices having N-K rows. If the K columns of $H_1$ are desired to be combined into M separate submatrices each having $N_c$=K/M columns numbered j=0, . . . , K/M-1, then each of the M submatrices can be "seeded" by a set of random numbers, $\{x_{I,i}, I=0, \ldots, d_{v,I}, i=0, \ldots, M-1\}$, where $d_{v,I}$ is the degree of the bit nodes in the ith submatrix. The desired row (check node) addresses for connected edges are given by:

$$a_{I,j+iM} = [x_{I,i} + (j+iK/M)\bmod(K/M)Q](N-K) = [x_{I,i} + (j)\bmod(K/M)Q]\bmod(N-K),$$

for a judicious choice of the multiplicand, Q, where "mod" denotes a modulus operation.

In one embodiment of the invention, the LDPC encoder 206 applies LDPC coding with the following parameters: N=64,800, Q=18, $N_c$=600 (i.e., 600 columns per submatrix of the $H_1$ portion of the parity check matrix). There are 16 such submatrices having column degree 12 and 74 submatrices having column degree 3. The staircase portion of the check matrix ($H_2$) has 10,799 columns of degree 2. The row degree is 25. The column and row degree distribution polynomials are, respectively:

$$\lambda(x) = 0.08x + 0.4933333x^2 + 0.4266667x^{11}$$

$$\rho(x) = x^{24}$$

The code graph has 269,999 edges. The address generators for this code are given in Table 1 of Appendix A.

The rate 5/6 LDPC encoder forms N-K=10,800 parity bits, $p_0, \ldots, p_{10,799}$, from K=54,000 systematic information bits, $i_0, \ldots, i_{53,999}$, by the following procedure:

1) Initialize $p_0 = p_1 = \ldots = p_{10,799} = 0$;
2) Accumulate the first info bit $i_0$ at parity addresses given by the first row of numbers in Table 1 of Appendix A, e.g.,
   $p_0 = p_0 \oplus i_0$, $p_{4362} = p_{4362} \oplus i_0$, $p_{416} = p_{416} \oplus i_0$,
   $p_{8909} = p_{8909} \oplus i_0$, $p_{4156} = p_{4156} \oplus i_0$, $p_{3216} = p_{3216} \oplus i_0$,
   $p_{3113} = p_{3113} \oplus i_0$, $p_{2560} = p_{2560} \oplus i_0$, $p_{2912} = p_{2912} \oplus i_0$,
   $p_{6405} = p_{6405} \oplus i_0$, $p_{8593} = p_{8593} \oplus i_0$, $p_{4969} = p_{4969} \oplus i_0$;
3) For the info bits $i_m$, m=1,2, . . . , 599 accumulate $i_m$ at parity bit addresses $\{x + m \cdot \bmod(600) \cdot 18\} \bmod(10800)$ where x denotes the address of the parity bit accumulator corresponding to the first bit $i_0$, e.g., $p_{18} = p_{18} \oplus i_1$, $p_{4380} = p_{4380} \oplus i_1$, etc;
4) For the $601^{st}$ info bit $i_{600}$, the addresses are given in the second row of Table 1 and similar to the previous step the addresses of parity bit accumulators for $i_m$, m=601, 602, . . . , 1199 are obtained using $\{x + m \cdot \bmod(600) \cdot 18\} \bmod(10800)$ where x denotes the address of the parity bit accumulator corresponding to the first bit $i_{600}$, i.e., the entries in the second row of Table 1;
5) In a similar manner a new row from Table 1 is used for each successive group of 600 information bits; and
6) After all information bits are used in the above calculations the final parity bit values are found in a stair step fashion by sequentially performing $p_i = p_i \oplus p_{i-1}$ for i=1, 2, . . . , 10799.

This procedure generates a codeword of length 64,800 bits comprising 54,000 information bits and 10,800 parity bits. The irregular parity check matrix for this code has 16×600=9600 columns of weight 12, 74×600=44,400 columns of weight 3, 18×600-1=10799 columns of weight 2, and one column of weight 1. Conversely, the parity check matrix has one row of weight of 24 and N-K-1=10799 rows of weight 25. The total number of edges in the bipartite graph (connecting codeword bit nodes to parity check nodes) or, equivalently the number of 1's in the parity check matrix, for this code is 9600×12+44,400×3+10799×2+1=269,999. The calculation is similarly performed from the row weights as 10799×25+24=269,999.

With renewed reference to FIG. 2, the LDPC encoder 206 computes a 64,800 bit codeword from the 54,000 input bits. The codewords produced by the LDPC encoder 206 are processed by the bit interleaver/grouper 208. The bit interleaver/grouper 208 spreads the elite bit nodes (nodes having high degree, e.g., 12) in an approximate uniform manner throughout the bits within QAM symbols and across symbols within the frame. The number of elite bit nodes (9600) in the systematic LDPC codeword does not divide evenly into the number of QAM symbols per frame (16,200). The ratio 16,200/9600=1.6875 implies that 32 elite bit nodes can be placed within every 54 QAM symbols.

In one embodiment, the bit interleaver/grouper 208 comprises a non-uniform interleaver. The ratio of codeword length, N, to number of elite bit nodes is 64,800/9600=6.75. The interleaver includes 6 columns of length 9600 and one column of length 0.75×9600=7200 bits. Encoded bits are written into the columns, filling the leftmost column first. Interleaved bits are read sequentially from rows starting in the first row; 7 bits are read from rows 1 through 7200 and 6 bits are read from rows 7201 to 9600. The sequential bit stream produced in this manner is then parsed into groups of 4 bits that become LSBs of the QAM symbols. The bit interleaver/grouper 208 produces 16,200 4-bit values per frame.

Figure 3:
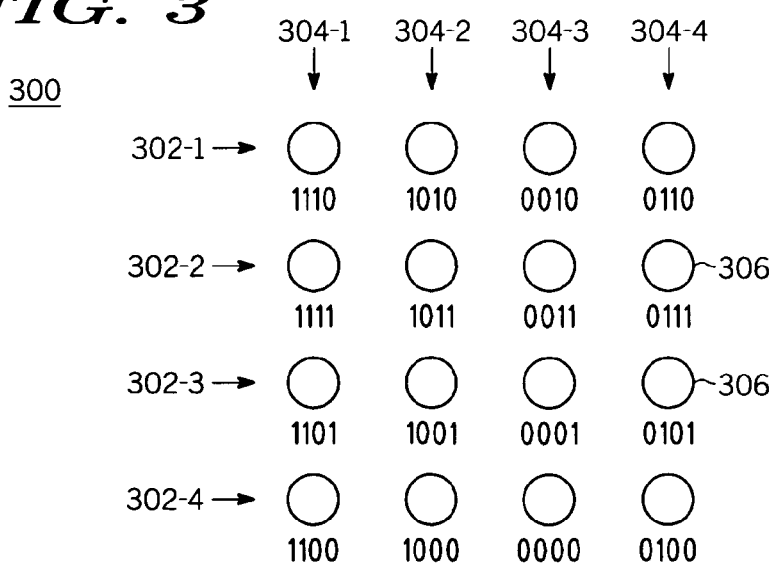

The QAM mapper 210 receives the bits from the bit grouper 204 and the bits from the bit interleaver/grouper 208, where the combined bits form 16,200 symbols. The QAM mapper 210 maps the input symbols onto an M-QAM constellation. As illustrated in FIG. 3, the 4 coded bits of each symbol are mapped to Gray coded LSBs of a constellation point. In particular, the 4 coded bits of each symbol can be mapped to a value 306 in one of the rows 302-1 through 302-4 and one of the columns 304-1 through 304-4 of a matrix 300. The mapping derived from the matrix 300 comprises the LSBs of a constellation point in the M-QAM constellation. The MSBs of the constellation point are determined by the un-coded bits.

As illustrated in FIG. 4, for 64 QAM, the two un-coded bits choose the I, Q quadrant of the constellation point. In particular, the two un-coded bits select one of the quadrants 402 of the constellation 400, where each of the quadrants 402 includes the matrix 300 of FIG. 3. The two bits associated with a quadrant comprise the MSBs of a constellation point of the 64-QAM constellation. As illustrated in FIG. 5, for 256 QAM, the four un-coded bits select one of the regions 502 of the constellation 500, where each of the regions 502 includes the matrix 300 of FIG. 3. The four bits associated with a region comprise the MSBs of a constellation point of the 256-QAM constellation. As illustrated in FIG. 6, for 1024 QAM, the six un-coded bits select one of the regions 602 of the constellation 600, where each of the regions 602 includes the matrix 300. The six bits associated with a region comprise MSBs of a constellation point in the 1024-QAM constellation. In general, constellation points in the M-QAM constellation having the same 4-bit coded LSB values are spaced far apart in Euclidean distance (e.g., a minimum distance of $8^2$=64). As described below, in the decoder, the LDPC code corrects for LSB errors and the QAM point containing those LSB values that is closest to the received sample pair is chosen to determine the MSBs. The Gray coding of MSBs and LSBs helps minimize the number of decoding errors. The output of the QAM mapper 210 is modulated by the modulator 112 for transmission towards one or more decoding devices.

Figure 9:
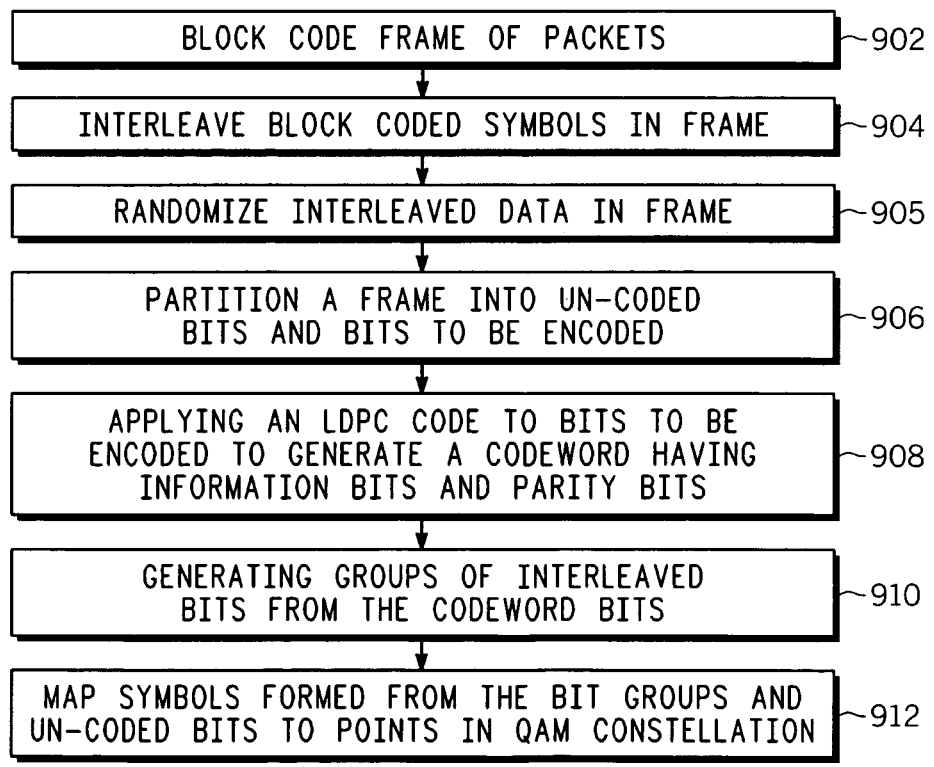
FIG. 9 is a flow diagram depicting an exemplary embodiment of a method for encoding content in accordance with one or more aspects of the invention.

FIG. 9 is a flow diagram depicting an exemplary embodiment of a method 900 for encoding content in accordance with one or more aspects of the invention. The method 900 begins at step 902, where a frame of packets is block coded to produce block coded symbols. At step 904, the block coded symbols in the frame are interleaved using convolutional interleaving. At step 905, the interleaved symbols in the frame are randomized. At step 906, the frame is partitioned into un-coded bits and bits to be encoded. At step 908, an LDPC code is applied to the bits to be encoded to generate a codeword having information bits and parity bits. In one embodiment, for each bit of the bits to be encoded, the bit is accumulated at accumulators associated with specific parity check equations, where an index of each of the accumulators with respect to the parity check bits is defined in accordance with:

$$[x+(j) \mod(N_c)Q] \mod(N-K),$$

where x is a seed value selected from a table of seed values, j is an index of the bit with respect to the bits to be encoded, $N_c$ is the number of columns per submatrix of the $H_1$ portion of the parity check matrix H, and N−K is the number of check nodes. In one embodiment, $N_c$ is 600, Q is 18, N is 64,800, and K is 54,000. At step 910, groups of interleaved bits are generated from the codeword bits. At step 912, symbols formed from the bit groups and un-coded bits are mapped to points in a QAM constellation. The method 900 is repeated for each frame.

Figure 7:
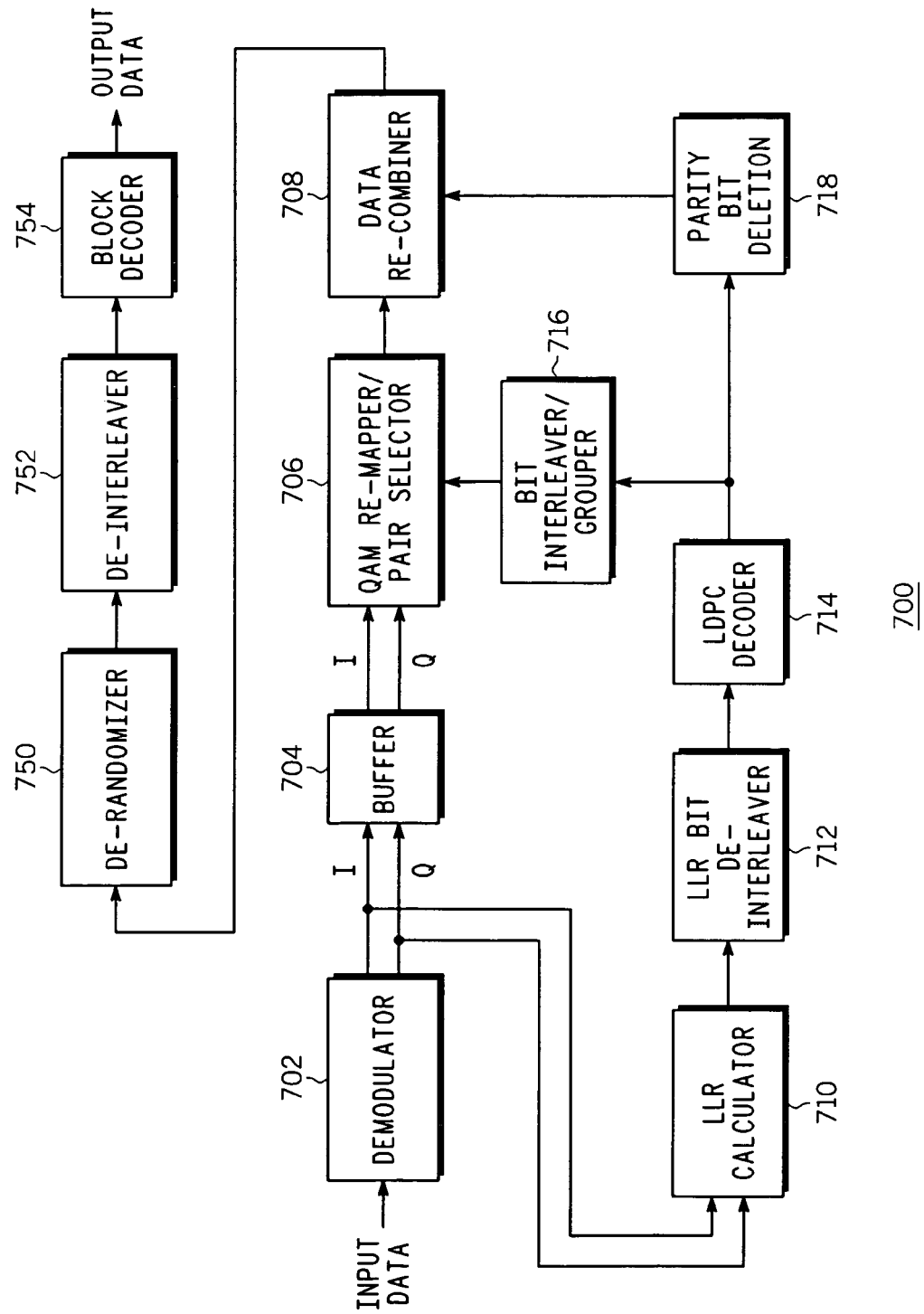
FIG. 7 is a block diagram depicting an exemplary embodiment of a decoder for decoding the modulated output of the content encoding system of FIG. 1 constructed in accordance with one or more aspects of the invention.

FIG. 7 is a block diagram depicting an exemplary embodiment of a decoder 700 for decoding the modulated output of the content encoding system 100 of FIG. 1 constructed in accordance with one or more aspects of the invention. The decoder 700 includes a demodulator 702, a buffer 704, a QAM re-mapper/pair selector 706, a data re-combiner 708, a log-likelihood ratio (LLR) calculator 710, an LLR bit de-interleaver 712, an LDPC decoder 714, a bit-interleaver/grouper 716, a parity bit deletion module 718, a de-randomizer 750, a de-interleaver 752, and a block decoder 754. The demodulator 702 receives the modulated data from the encoding system 100. The demodulator 702 demodulates the data using well-known QAM demodulation techniques to produce 16,200 in-phase and quadrature (I and Q) values per frame. That is, there is one I, Q pair of values per symbol in the frame. The I, Q pairs produced by the demodulator 702 are stored in the buffer 704 and are provided to the LLR calculator 710.

The LLR calculator 710 computes an LLR from the received I and Q sample values. A soft-decision is required for each of the 4 LSB bits in the M-QAM symbol. The LLR calculator 710 may apply a simplified max{log p(y|x)} algorithm, as described in G. Caire et al., "Bit-Interleaved Coded Modulation," IEEE Trans. Inform. Theory, vol. 44, pp. 927-946, May 1998. Notably, constellation points are grouped into subsets $\chi_b^i$, which are the sets of points that have value b∈{0,1} for the ith bit location in the QAM symbol. Likelihood metrics $$\lambda^i(y, b) = \max\{\log p(y|x)\} \qquad \text{Eq. 7}$$

are calculated for the received point, y, and each possible bit location i=0,1,2,3, for b∈{0,1}, where the maximum is taken over all x∈$x_b^i$. For the AWGN channel, maximization of the logarithm of the transition probability is equivalent to minimizing the Euclidean distance. The final LDPC decoder input LLR for each LSB is given by:

$$LLR^i = \lambda^i(y,1) - \lambda^i(y,0) \qquad \text{Eq. 8}$$

The LLR calculator 710 produces 64,800 LLRs per frame. The LLRs are multi-level values. The LLR bit de-interleaver 712 de-interleaves the LLRs produced by the LLR calculator 710. In particular, the LLRs are written sequentially by rows into an irregular memory as described above for the bit interleaver/grouper 208. The LLRs are read out by columns to produce a stream of LLRs. The LDPC decoder 714 decodes the output of the LLR bit de-interleaver 712. Notably, the LDPC decoder 714 implements a 60-iteration, quantized, message passing decoder to decode all 64,800 bits and produce estimates of the corrected parity bits.

In particular, as discussed above, LDPC codes can be represented by bipartite graphs with bit nodes on one side and check nodes on the other with interconnections specifying the bit nodes that participate in a given check node's parity check equation. The well-known sum-product message passage algorithm may be used to decode the received signals using soft (multi-level) LLRs provided by the LLR calculator 710. The message passed from a bit to check node is the sum of the input LLR and all the check-to-bit node LLR messages, excluding the LLR for the outgoing edge given by the following equation:

$$v = u_0 + \sum_{i=1}^{d_v-1} u_i, \quad \text{Eq. 9}$$

where $d_v$ is the degree of the bit (variable) node being operated one. The message passed from check to bit nodes is calculated from a product of tanh functions of scaled check node input LLRs, excluding the input LLR for the output edge for which the message applies:

$$u = 2\tanh^{-1}\left(\prod_{j=1}^{d_c-1} \tanh\frac{v_j}{2}\right), \quad \text{Eq. 10}$$

where $d_c$ is the degree of the check node being operated one. The messages of Equations 9 and 10 can be quantized and clipped (limited).

The output of the LDPC decoder 714 is re-interleaved and re-combined into 4-bit groups by the bit-interleaver/grouper 716 to form 16,200 4-bit LSBs. The bit-interleaver/grouper 716 performs the same operation of the bit interleave/group module 208 in the encoding system 100. The parity bit deletion module 718 processes the output of the LDPC decoder 714 to delete the parity bits and produce 54,000 information bits per frame. The QAM re-mapper/pair selector 706 selects the un-coded MSBs from the 16,200 (I,Q) demodulator output values stored in the buffer 704 in accordance with the 16,200 4-bit LSBs produced by the bit-interleaver/grouper 716. For each symbol, this computation includes finding the ideal QAM constellation point having the decoded 4-bits as LSBs that is closest in Euclidean distance to the corresponding (I,Q) demodulator output stored in the buffer 704. The MSBs from the resultant ideal QAM points are selected as the un-coded bit pairs and, together with the information bits from the parity bit deletion module 718, are re-combined by the data re-combiner 708 to form the fully decoded 86,400, 118,800, or 151,200 bit data frame for 64-, 256-, or 1024-QAM, respectively.

The data frames output by the data re-combiner 708 are received by the de-randomizer 750. The de-randomizer 750 performs the inverse operation of the randomizer 108. The output of the de-randomizer 750 is received by the de-interleaver 752, which performs the inverse operation of the interleaver 106. Output of the de-interleaver 752 is processed by the block decoder 754, which performs bounded distance decoding of the RS block code 104.

Figure 8:
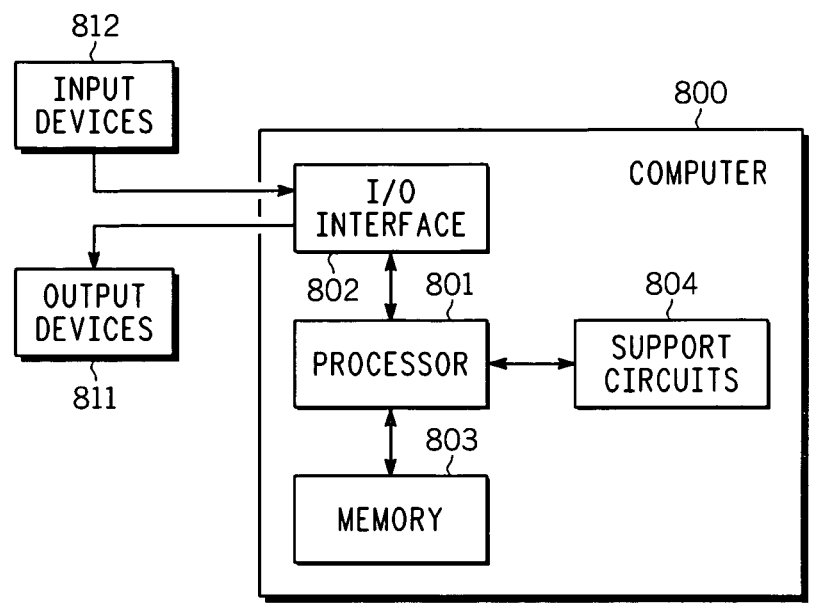
FIG. 8 is a block diagram depicting an exemplary embodiment of a computer suitable for implementing the encoding system and/or decoder described herein.

FIG. 8 is a block diagram depicting an exemplary embodiment of a computer 800 suitable for implementing the processes and methods described herein. The computer 800 may be used to implement in software the encoding system 100 or the decoder 700. The computer 800 includes a processor 801, a memory 803, various support circuits 804, and an I/O interface 802. The processor 801 may be any type of microprocessor known in the art. The support circuits 804 for the processor 801 include conventional cache, power supplies, clock circuits, data registers, I/O interfaces, and the like. The I/O interface 802 may be directly coupled to the memory 803 or coupled through the processor 801. The I/O interface 802 may be coupled to various input devices 812 and output devices 811, such as a conventional keyboard, mouse, printer, display, and the like.

The memory 803 may store all or portions of one or more programs, program information, and/or data to implement the functions of the elements in the encoding system 100 or the decoder 700. Although the present embodiment is disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to illustrative embodiments of the present invention, other and further embodiments of the invention may be devised without departing from the basic scope thereof, and the scope thereof is determined by the claims that follow.

Appendix A

TABLE 1

| | | | | | | | | | | | |
|---|---|---|---|---|---|---|---|---|---|---|---|
| 0 | 4362 | 416 | 8909 | 4156 | 3216 | 3113 | 2560 | 2912 | 6405 | 8593 | 4969 |
| 1 | 2479 | 1786 | 8978 | 3011 | 4337 | 9314 | 6397 | 2957 | 7288 | 5484 | 6031 |
| 2 | 10175 | 9009 | 9889 | 3091 | 4985 | 7267 | 4092 | 8874 | 5671 | 2777 | 2189 |
| 3 | 9052 | 4795 | 3924 | 3370 | 10059 | 1128 | 9996 | 10165 | 9360 | 4297 | 434 |
| 4 | 2379 | 7834 | 4835 | 2327 | 9843 | 804 | 329 | 8353 | 7167 | 3070 | 1528 |
| 5 | 3435 | 7876 | 348 | 3693 | 1876 | 6585 | 10340 | 7144 | 5864 | 2084 | 4052 |
| 6 | 3917 | 3110 | 3477 | 1304 | 10331 | 5939 | 5161 | 1611 | 1991 | 699 | 8316 |
| 7 | 6871 | 3237 | 1723 | 10752 | 7891 | 9764 | 4745 | 3888 | 10009 | 4176 | 4614 |
| 8 | 10576 | 2195 | 1689 | 2968 | 5420 | 2580 | 2883 | 6512 | 111 | 6023 | 1024 |
| 9 | 3786 | 8593 | 2074 | 3321 | 5057 | 1450 | 3840 | 5444 | 6572 | 3094 | 9892 |
| 10 | 8548 | 1848 | 10372 | 4585 | 7313 | 6536 | 6379 | 1766 | 9462 | 2456 | 5606 |
| 11 | 8204 | 10593 | 7935 | 3636 | 3882 | 394 | 5968 | 8561 | 2395 | 7289 | 9267 |
| 12 | 7795 | 74 | 1633 | 9542 | 6867 | 7352 | 6417 | 7568 | 10623 | 725 | 2531 |
| 13 | 7151 | 2482 | 4260 | 5003 | 10105 | 7419 | 9203 | 6691 | 8798 | 2092 | 8263 |

TABLE 1-continued

| | | | | | | | | | | | |
|---|---|---|---|---|---|---|---|---|---|---|---|
| 14 | 3600 | 570 | 4527 | 200 | 9718 | 6771 | 1995 | 8902 | 5446 | 768 | 1103 |
| 15 | 6723 | 10217 | 8716 | 5138 | 7318 | 2780 | 9960 | 1567 | 4449 | 1512 | 9975 |
| 16 | 6304 | 7621 | | | | | | | | | |
| 17 | 6498 | 9209 | | | | | | | | | |
| 0 | 7293 | 6795 | | | | | | | | | |
| 1 | 5950 | 1719 | | | | | | | | | |
| 2 | 8521 | 1793 | | | | | | | | | |
| 3 | 6174 | 7854 | | | | | | | | | |
| 4 | 9773 | 1190 | | | | | | | | | |
| 5 | 9517 | 10268 | | | | | | | | | |
| 6 | 2181 | 9349 | | | | | | | | | |
| 7 | 1949 | 5560 | | | | | | | | | |
| 8 | 1567 | 555 | | | | | | | | | |
| 9 | 8601 | 3839 | | | | | | | | | |
| 10 | 5072 | 1057 | | | | | | | | | |
| 11 | 7928 | 3542 | | | | | | | | | |
| 12 | 3226 | 3762 | | | | | | | | | |
| 13 | 7045 | 2420 | | | | | | | | | |
| 14 | 9645 | 2658 | | | | | | | | | |
| 15 | 2774 | 2452 | | | | | | | | | |
| 16 | 5331 | 2043 | | | | | | | | | |
| 17 | 9400 | 7502 | | | | | | | | | |
| 0 | 1850 | 2327 | | | | | | | | | |
| 1 | 10456 | 9774 | | | | | | | | | |
| 2 | 1692 | 9276 | | | | | | | | | |
| 3 | 10037 | 4038 | | | | | | | | | |
| 4 | 3967 | 338 | | | | | | | | | |
| 5 | 2640 | 5087 | | | | | | | | | |
| 6 | 858 | 3473 | | | | | | | | | |
| 7 | 5582 | 5683 | | | | | | | | | |
| 8 | 9523 | 916 | | | | | | | | | |
| 9 | 4106 | 1559 | | | | | | | | | |
| 10 | 4506 | 3491 | | | | | | | | | |
| 11 | 8191 | 4182 | | | | | | | | | |
| 12 | 10192 | 6157 | | | | | | | | | |
| 13 | 5662 | 3303 | | | | | | | | | |
| 14 | 3449 | 1540 | | | | | | | | | |
| 15 | 4766 | 2691 | | | | | | | | | |
| 16 | 4069 | 6675 | | | | | | | | | |
| 17 | 8069 | 5893 | | | | | | | | | |
| 0 | 1117 | 1016 | | | | | | | | | |
| 1 | 5619 | 3085 | | | | | | | | | |
| 2 | 8483 | 8400 | | | | | | | | | |
| 3 | 8255 | 394 | | | | | | | | | |
| 4 | 6337 | 5045 | | | | | | | | | |
| 5 | 6174 | 5138 | | | | | | | | | |
| 6 | 7203 | 1989 | | | | | | | | | |
| 7 | 1781 | 5170 | | | | | | | | | |
| 8 | 1464 | 3559 | | | | | | | | | |
| 9 | 3376 | 4214 | | | | | | | | | |
| 10 | 7238 | 67 | | | | | | | | | |
| 11 | 10588 | 8832 | | | | | | | | | |
| 12 | 1223 | 6513 | | | | | | | | | |
| 13 | 5309 | 4652 | | | | | | | | | |
| 14 | 1429 | 9749 | | | | | | | | | |
| 15 | 7878 | 5131 | | | | | | | | | |
| 16 | 4433 | 10284 | | | | | | | | | |
| 17 | 6331 | 5498 | | | | | | | | | |
| 0 | 6663 | 4941 | | | | | | | | | |
| 1 | 9614 | 10238 | | | | | | | | | |
| 2 | 8401 | 8025 | | | | | | | | | |
| 3 | 9156 | 5630 | | | | | | | | | |
| 4 | 7067 | 8892 | | | | | | | | | |
| 5 | 9027 | 3414 | | | | | | | | | |
| 6 | 1690 | 3866 | | | | | | | | | |
| 7 | 2854 | 8469 | | | | | | | | | |
| 8 | 6206 | 630 | | | | | | | | | |
| 9 | 363 | 5453 | | | | | | | | | |
| 10 | 4123 | 7008 | | | | | | | | | |
| 11 | 1612 | 6700 | | | | | | | | | |
| 12 | 9069 | 9226 | | | | | | | | | |
| 13 | 5767 | 4060 | | | | | | | | | |
| 14 | 3743 | 9236 | | | | | | | | | |
| 15 | 7018 | 5572 | | | | | | | | | |
| 16 | 8896 | 4536 | | | | | | | | | |
| 17 | 853 | 6057 | | | | | | | | | |

What is claimed is:

1. A method of encoding transport stream packets, comprising:
    block coding frames of transport stream packets to produce block coded symbols;
    interleaving the block coded symbols for each of the frames using convolutional interleaving to produce interleaved data;
    randomizing the interleaved data;
    set partitioning the interleaved data for each of the frames into un-coded bits and bits to be encoded; and
    for each of the frames:
        applying a low density parity check (LDPC) code to the bits to be encoded to generate a codeword having information bits and parity bits;
        generating groups of interleaved bits from bits in the codeword; and
        mapping symbols formed from the groups of interleaved bits and the un-coded bits to points in a quadrature amplitude modulation (QAM) constellation.

2. The method of claim 1, further comprising:
    applying finite impulse response (FIR) parity check coding to the transport stream packets prior to the step of block coding.

3. The method of claim 1, wherein the step of block coding comprises:
    applying (128,122) t=3 byte Reed Solomon (RS) coding over GF(128) to the transport stream packets to produce the block coded symbols.

4. The method of claim 3, wherein the convolutional interleaving comprises I=128, J=1, 2, 3, or 4 convolutional interleaving.

5. The method of claim 1, wherein the step of block coding comprises:
    applying (195,187) t=4 byte Reed Solomon (RS) coding over GF(256) to the transport stream packets to produce the block coded symbols.

6. The method of claim 5, wherein the convolutional interleaving comprises I=195, J=1 convolutional interleaving.

7. The method of claim 1, wherein the applying step comprises, for each bit of the bits to be encoded:
    accumulating the bit at accumulators associated with parity check equations, where an index of each of the accumulators with respect to the parity check equations is defined in accordance with:

$[x+(j) \mod(N_c) Q] \mod(N-K)$, where x is a seed value selected from a table of seed values, j is an index of the bit with respect to the bits to be encoded, $N_c$ is equal to 600, Q is equal to 18, N is equal to 64,800, K is equal to 54,000, and mod denotes a modulus operation.

8. Apparatus for encoding transport stream packets, comprising:
    a block coder for block coding frames of transport stream packets to produce block coded symbols;
    an interleaver for interleaving the block coded symbols for each of the frames using convolutional interleaving to produce interleaved data;
    a randomizer for randomizing the interleaved data;
    a data parser for set partitioning the interleaved data for each of the frames into un-coded bits and bits to be encoded;
    an encoder for applying a low density parity check (LDPC) code to the bits to be encoded for each frame to generate a codeword for each frame, the codeword having information bits and parity bits;
    a bit interleaver/grouper for generating groups of interleaved bits from bits in the codeword for each frame; and
    a quadrature amplitude modulation (QAM) mapper for mapping symbols formed from the groups of interleaved bits and the un-coded bits to points in a QAM constellation.

9. The apparatus of claim 8, further comprising:
    a framer for applying finite impulse response (FIR) parity check coding to the transport stream packets.

10. The apparatus of claim 8, wherein the block coder is configured to apply (128,122) t=3 byte Reed Solomon (RS) coding over GF(128) to the transport stream packets to produce the block coded symbols.

11. The apparatus of claim 10, wherein the convolutional interleaver is configured to perform I=128, J=1, 2, 3, or 4 convolutional interleaving.

12. The apparatus of claim 8, wherein the block coder is configured to apply (195,187) t=4 byte Reed Solomon (RS) coding over GF(256) to the transport stream packets to produce the block coded symbols.

13. The apparatus of claim 12, wherein the convolutional interleaver is configured to perform I=195, J=1 convolutional interleaving.

14. The apparatus of claim 8, wherein the encoder is configured to, for each bit of the bits to be encoded:
    accumulate the bit at accumulators associated with parity check equations, where an index of each of the accumulators with respect to the parity check equations is defined in accordance with:

$[x+(j) \mod(N_c) Q] \mod(N-K)$, where x is a seed value selected from a table of seed values, j is an index of the bit with respect to the bits to be encoded, $N_c$ is equal to 600, Q is equal to 18, N is equal to 64,800, K is equal to 54,000, and mod denotes a modulus operation.

15. Apparatus for encoding transport stream packets, comprising:
    means for block coding frames of transport stream packets to produce block coded symbols;
    means for interleaving the block coded symbols for each of the frames using convolutional interleaving to produce interleaved data;
    means for randomizing the interleaved data;
    means for set partitioning the interleaved data for each of the frames into un-coded bits and bits to be encoded; and
    means for applying a low density parity check (LDPC) code to the bits to be encoded for each frame to generate a codeword for each frame, the codeword having information bits and parity bits;
    means for generating groups of interleaved bits from bits in the codeword for each frame; and
    means for mapping symbols formed from the groups of interleaved bits and the un-coded bits to points in a QAM constellation, the un-coded bit to points in a quadrature amplitude modulation (QAM) constellation.

16. The apparatus of claim 15, further comprising:
    means for applying finite impulse response (FIR) parity check coding to the transport stream packets prior to the step of block coding.

17. The apparatus of claim 15, wherein the means for block coding comprises:
    means for applying (128,122) t=3 byte Reed Solomon (RS) coding over GF(128) to the transport stream packets to produce the block coded symbols.

18. The apparatus of claim 17, wherein the convolutional interleaving comprises I=128, J=1, 2, 3, or 4 convolutional interleaving.

19. The apparatus of claim 15, wherein the means for block coding comprises:
  means for applying (195,187) t=4 byte Reed Solomon (RS) coding over GF(256) to the transport stream packets to produce the block coded symbols.

20. The apparatus of claim 19, wherein the convolutional interleaving comprises I=195, J=1 convolutional interleaving.

* * * * *

UNITED STATES PATENT AND TRADEMARK OFFICE
CERTIFICATE OF CORRECTION

PATENT NO. : 7,451,361 B2
APPLICATION NO. : 11/302445
DATED : November 11, 2008
INVENTOR(S) : Schmidt It is certified that error appears in the above-identified patent and that said Letters Patent is hereby corrected as shown below:

In Column 5, Line 43, delete "(N-K)-(N-K)" and insert --(N-K)×(N-K)--

In Column 5, Line 60, in Equation, delete "$(K/M)Q](N–K)$" and insert --(K/M)Q]mod(N-K)--

Signed and Sealed this

Twenty-fifth Day of August, 2009

David J. Kappos
*Director of the United States Patent and Trademark Office*